(12) United States Patent
Niemi et al.

(10) Patent No.: US 7,847,711 B2
(45) Date of Patent: Dec. 7, 2010

(54) GENERATING A DATA STREAM AND IDENTIFYING POSITIONS WITHIN A DATA STREAM

(75) Inventors: Sami Niemi, Skanor (SE); Johan Sten, Malmo (SE)

(73) Assignee: Scalado AB, Lund (SE)

( * ) Notice: Subject to any disclaimer, the term of this patent is extended or adjusted under 35 U.S.C. 154(b) by 0 days.

(21) Appl. No.: 12/644,690

(22) Filed: Dec. 22, 2009

(65) Prior Publication Data

US 2010/0098107 A1 Apr. 22, 2010
US 2010/0265966 A2 Oct. 21, 2010

Related U.S. Application Data

(63) Continuation of application No. 12/031,872, filed on Feb. 15, 2008, now Pat. No. 7,652,595.

(60) Provisional application No. 60/891,439, filed on Feb. 23, 2007.

(30) Foreign Application Priority Data

Feb. 16, 2007 (SE) .................................... 0700446
Jul. 11, 2007 (SE) .................................... 0701690

(51) Int. Cl.
*H03M 7/40* (2006.01)
(52) U.S. Cl. ......................................... 341/67; 341/65
(58) Field of Classification Search .................. 341/67, 341/65, 50, 55; 382/232, 233
See application file for complete search history.

(56) References Cited

U.S. PATENT DOCUMENTS

| | | | |
|---|---|---|---|
| 4,967,196 A | 10/1990 | Sprague et al. | |
| 5,349,348 A | 9/1994 | Anderson et al. | |
| 6,281,874 B1 | 8/2001 | Sivan et al. | |
| 6,308,257 B1 | 10/2001 | Theogarajan et al. | |
| 6,381,371 B1 | 4/2002 | Epstein et al. | |
| 6,553,145 B1 | 4/2003 | Kang et al. | |
| 6,560,745 B1 | 5/2003 | McCloskey et al. | |
| 6,693,566 B2 | 2/2004 | Jaffe et al. | |
| 6,947,599 B2 | 9/2005 | Takemura | |
| 6,950,043 B2 | 9/2005 | Kikuchi et al. | |
| 7,076,104 B1 | 7/2006 | Keith et al. | |
| 7,146,053 B1 | 12/2006 | Rijavec et al. | |
| 7,463,775 B1 | 12/2008 | Sites | |
| 2004/0086041 A1 | 5/2004 | Ye et al. | |
| 2004/0175047 A1 | 9/2004 | Gormish et al. | |
| 2004/0175059 A1 | 9/2004 | Willner et al. | |
| 2005/0008236 A1 | 1/2005 | Hachiyama et al. | |
| 2005/0206658 A1 | 9/2005 | Fagans | |
| 2006/0023953 A1 | 2/2006 | Kliorin et al. | |
| 2006/0182274 A1 | 8/2006 | Nicolai et al. | |
| 2006/0233257 A1 | 10/2006 | Keith et al. | |
| 2006/0269147 A1 | 11/2006 | Shen et al. | |

FOREIGN PATENT DOCUMENTS

| | | |
|---|---|---|
| EP | 1584937 A1 | 10/2005 |
| GB | 2435334 A | 8/2007 |
| WO | 0109836 A1 | 2/2001 |
| WO | 0233976 A1 | 4/2002 |
| WO | 2005032119 A1 | 4/2005 |

*Primary Examiner*—Peguy JeanPierre
(74) *Attorney, Agent, or Firm*—Volpe and Koenig, P.C.

(57) ABSTRACT

Methods and apparatus, including computer program products, for generating a data stream encoded by means of a Variable Length Coding scheme. Code words for a data stream including a plurality of code words are encoded in accordance with a Variable Length Coding scheme. A separation marker is inserted between encoded data blocks in the data stream.

14 Claims, No Drawings

GENERATING A DATA STREAM AND IDENTIFYING POSITIONS WITHIN A DATA STREAM

CROSS REFERENCE TO RELATED APPLICATIONS

This application is a continuation of U.S. patent application Ser. No. 12/031,872 filed on Feb. 15, 2008 which claims the benefit of U.S. provisional application 60/891,439 filed on Feb. 23, 2007, which are incorporated by reference as if fully set forth.

This application is also claiming the benefit of Swedish application 0700446-8 filed Feb. 16, 2007 and Swedish application 0701690-0 filed on Jul. 11, 2007, the contents of all of which are incorporated by reference as if fully set forth.

TECHNICAL FIELD

The present invention relates to methods and apparatus, including computer program products, for generating a data stream encoded by means of a Variable Length Coding scheme and to a method for identifying the position of a code word within a stream of Variable Length Codes.

BACKGROUND

Today images, such as photographs, still pictures, graphics etc., are commonly viewed in any electronic device having a display. However, it is not enough to enable images being viewed on a display; it is also crucial that the images can be displayed in a reasonable time, as the size of the captured images increases. The users of electronic devices displaying images on a display are in most cases interested in being able to alter the view of the image. Some common operations requested by the user are to zoom into an image to view details of the image, pan in the zoomed image in order to trace a feature or just to get an overview of the details, rotate images in order to facilitate viewing on the display, etc. Moreover, the images handled by users of such electronic devices are of increasing resolution, i.e. the number of pixels defining an image becomes greater and greater.

The electronic devices may, for example, be mobile telephones, personal digital assistance, palm tops, or other devices having limited processing capacity in view of the images to be handled. For instance, a lot of electronic devices having a display for viewing images do not include enough processing capacity to perform operations such as zoom, pan, etc. without presenting frequently occurring and annoying delays between consecutively presented views. This may result in that continuously zooming in or out of an image may be experienced as a presentation of a plurality of images with long delay in-between images. Thus, no experience of continuous zoom is achieved, which may be irritating for the user. This may also result in erroneous handling or inputs by the user.

One common way to address this problem is either to increase the processing capacity of the device or to avoid operations in which the user expects an experience of continuous flow.

SUMMARY

The present invention improves operations on Variable Length Coded streams and or images and improves the experience for the user of continuous operations on such streams and/or images, as well as improves the time to decode a captured image to screen.

According to one aspect of the invention this is achieved by a method for generating a data stream encoded by means of a Variable Length Coding scheme. The method comprises encoding code words for a data stream including a plurality of code words in accordance with a Variable Length Coding scheme, and inserting a separation marker between encoded code words in the data stream.

By introducing a separation marker partial access to a data stream of variable length codes is facilitated. For example, it becomes possible to speed up access to image data representing an arbitrary area of an image coded by means of a variable length coding. Moreover, the marker makes it possible to access data forming part of the data in a data stream of variable length codes without the need of decoding every single code arranged ahead of the data to be accessed. Thereby, both time and processing capacity may be saved. The same advantages apply to the use of the markers in order to indicate separate data streams sharing the same transport or storage medium, e.g. multiplexed data streams.

In one embodiment inserting a separation marker is performed by inserting at least 16 consecutive binary ones after a specific code word. In another embodiment, the insertion of a separation marker is performed by inserting 16 consecutive binary zeros instead of 16 consecutive ones. By using a marker including 16 consecutive binary ones or zeros a search for the marker may be performed fast and efficiently. The reason for this is that it becomes possible to detect the marker on a byte level, i.e. 8 bits. The detection on a byte level is possible because a part of the marker, 16 consecutive binary ones or zeros, in the data stream of variable length codes will always be represented by a byte including only binary ones or binary zeros.

According to another embodiment the specific code word is the last code word of a data block. By making the marker identify the end of one and the beginning of another data block the access to individual data blocks may be facilitated and performed substantially faster.

According to yet another embodiment inserting a separation marker is performed by inserting at least 16 consecutive binary ones between two or more specific code words.

In one embodiment the method for generating a data stream encoded by means of a Variable Length Coding scheme comprises encoding data blocks of a data stream including a plurality of data blocks in accordance with a Variable Length Coding scheme, and inserting a separation marker between encoded data blocks in the data stream.

As mentioned in relation to one of the above embodiments the introducing of a separation marker facilitates partial access to a data stream of variable length codes. For example, it becomes possible to speed up access to image data representing an arbitrary area of an image coded by means of a variable length coding. Moreover, the marker makes it possible to access data forming part of the data in a data stream of variable length codes without the need of decoding every single code arranged ahead of the data to be accessed. Thereby, both time and processing capacity may be saved. The same advantages apply to the use of the markers in order to indicate separate data streams sharing the same transport or storage medium, e.g. multiplexed data streams. Moreover, by making the marker identify a data block the access to individual data blocks may be facilitated and performed substantially faster.

According to one embodiment the act of inserting separation marker further includes inserting the separation marker at a point in time after a previous block has been encoded and before a next encoded data block has been added to the previous data block.

In another embodiment the encoding and insertion of a separation marker are performed by hardware, thereby speeding up the insertion of the marker.

In one embodiment inserting a marker in the data stream is performed in connection with the data stream being encoded by means of the variable length coding scheme. By inserting the marker in connection with the data stream being encoded into a Variable length code the encoding may be performed substantially faster than if the markers were to be inserted into the data stream by decoding the entire stream.

According to another embodiment the encoding of data blocks is performed in accordance with a JPEG standard, and wherein each data block corresponds to a data unit in accordance with the JPEG standard. By inserting the markers into data streams including JPEG data blocks the access of particular parts of an image represented by the encoded data stream becomes faster and requires less processing capacity. Accordingly, operations on parts of an image may be facilitated.

According to another embodiment the method comprises inserting eight binary zeros before the separation marker, if the separation marker includes binary ones, or inserting eight binary ones before the separation marker, if the separation marker includes binary zeros. The inserting any of these sequences or any other known sequence before the separation marker the identification of the exact starting point in the data stream of the separation marker is facilitated. The sequence inserted before the separation marker may alternatively be a set of eight bits, wherein the set of eight bits includes at least one bit of binary zero value and the at least one bit of binary zero value is arranged in a predetermined position in the set of eight bits. Moreover, the predetermined position of the at least one bit of binary zero value may be the position as the least significant bit in the set of eight bits.

Another aspect of the invention uses a method for retrieving data relating to a code word of particular interest within a stream of variable length codes. The method comprises identifying the position of a predefined marker within the stream of variable length codes, calculating a start position of the code word of particular interest within the stream of variable length codes, and retrieving the data relating to the code word of particular interest.

By using a predefined marker in a data stream of variable length codes for identifying a position of interest in the data stream the access of this position may require less time and processing capacity than if the entire data stream is to be decoded in order to find the position. For example, it becomes possible to speed up access to image data representing an arbitrary area of an image coded by means of a variable length coding.

The marker also makes it possible to access data positioned within a data stream of variable length codes without the need of decoding every single code arranged ahead of the to be accessed.

The same advantages apply to the use of the markers in order to indicate separate data streams sharing the same transport or storage medium, e.g. multiplexed data streams.

According to a specific embodiment the method further comprises identifying the position of at least one additional predefined marker within the stream of variable length codes, calculating the start position of the at least one additional code word of particular interest within the stream of variable length codes, and retrieving the data relating to at least one additional code word of particular interest. Because a plurality of markers are identified and used in decoding the data stream the process may require even less time and processing power.

In another embodiment, retrieving the data relating to the code word of particular interest includes retrieving the calculated start position of the code word of particular interest within the data stream and inserting this start position into a list of features of the stream of variable length codes. By retrieving the position of the code word of particular interest and saving this position it is possible to map the data stream and thereby making it possible to perform even faster future accesses to parts of the data stream.

According to yet another embodiment, retrieving the data relating to the code word of particular interest includes retrieving the value represented by the specific code word. This embodiment speeds up the access to particular values to be more rarely used. For instance when performing operations on images which are not supposed to be saved.

In one embodiment the stream of variable length codes is a compressed representation of an image and the code word of particular interest is a DC-coefficient of a data unit in stream of variable length codes, thereby facilitating fast generation of reduced versions of captured images.

In some other embodiments markers corresponding to the markers mentioned in relation to the first aspect of the invention and the arrangement of codes preceding the marker as mentioned in relation to the first aspect of the invention presents substantially identical advantages when used in a method according to the second aspect of the invention.

In yet another embodiment the identifying of the position of the predefined marker further includes identifying a predetermined symbol arranged in the stream of Variable Length Codes next to the marker and wherein the transition from one of the predetermined symbol or the predefined marker to the predefined marker or the predetermined symbol is identified as the position of the marker. By implementing this embodiment the determination of the position of the predefined marker is facilitated.

According to another embodiment the predetermined symbol is an End Of Block symbol, EOB.

In yet another embodiment the calculation of the start position within the stream of Variable Length Codes of the specific code word is based on the position of the predefined marker and the known length of the marker.

According to another method the stream of variable length codes includes data blocks including a plurality of code words, wherein the code word of particular interest is the first code word of a data block, and thereby the calculating a start position of the code word of particular interest corresponds to calculating the start position of the data block. By making the marker identify the end of one and the beginning of another data block the access to individual data blocks may be facilitated and performed substantially faster.

DETAILED DESCRIPTION

The present invention relates to methods, apparatus, and computer program products for facilitating fast indexing of a stream of data blocks that has been coded by means of Variable Length Coding (VLC) schemes or entropy coding schemes. According to one embodiment of the invention the fast indexing is achieved by insertion of a data block separation marker between data blocks consecutively arranged in a data stream. In the present application a data stream should be understood as data related to each other by being part of the same data file, by being part of the same data message sent via a network, such message may be separated into different packages or sent in one continuous stream depending on the network, by being part of the same information stream, such as streaming audio or streaming video or a combination of these.

Embodiments of the invention are applicable to any type of data stream in which data blocks are encoded by means of a VLC scheme or entropy coding scheme, e.g. Huffman encoding, arithmetic encoding, etc. These encoding schemes are designed to compress information and one effect of using

| C | B | C | D | B | E | D | C | A | B | C | B | E | C | B |
|---|---|---|---|---|---|---|---|---|---|---|---|---|---|---|
| 111 | 110 | 111 | 0000 | 110 | 0001 | 0000 | 111 | 10 | 110 | 111 | 110 | 0001 | 111 | 110 | these encoding schemes is that not all symbols, also called code words, in an encoded data stream have the same code length.

However, the scheme of the codes are such that in order to know where one symbol ends and another one begins, it is necessary to process all previous symbols in the stream.

In the context of this application a symbol should be understood as one unit from a set of units, where each unit has an individual bit code assigned to them. In this application a data block should be understood as some data representing a portion of a larger data stream, e.g. a portion of image data, a portion of an audio stream, a rectangular image block of an image stream, etc.

In one embodiment it may be desirable that two or more variable length coded streams are mixed according to more specific rules, for instance by alternating n symbols from a first signal, and m symbols from a second signal, and k symbols from a third signal.

This poses a great difficulty in separating the signals at the receiving end as all the symbols have to be processed in order to find the boundaries between the different signals.

In another embodiment it may also be desirable to quickly find a specific symbol, or for instance every n:th symbol in a variable length coded stream. This also normally requires all the symbols to be processed in order to find the location of the desired symbols.

In yet another embodiment it is desirable to be able to send two or more signals through a single communication channel. This is usually achieved by alternating the two or more signals, so that n bits of the first signal is sent first, then m bits of the second signal is sent, and then b bits of the first signal is sent, and so on.

The present invention addresses the above problems in the use of variable length coded streams by introducing special markers that can be inserted in the stream generated in the variable length encoding process. These markers may be used to speed up the process of finding specific symbols in a data stream. Additionally the present invention introduces a method of removing the markers in an efficient way in order to create or recreate the original stream or streams.

Example Usage of the Marker:

A variable length coded stream is made of symbols that are of different bit lengths. The following symbols could, for instance, be represented by the following code words:

A=10
B=110
C=111
D=0000
E=0001

The bit stream for the following symbols "CBCDBED-CABCBECB" would become:

11111011 10000110 00010000 11110110 11111000 01111110

In order to decode the bit stream to the original symbols the bit stream has to be decoded from the left and the bits are read until a valid symbol is produced. By decoding the entire bit stream it is possible to understand where the boundaries between the symbols are located:

The problem with this approach is that it is relatively time consuming to perform in software, especially when many symbols have to be processed.

The same bit stream written in hexadecimal numbers corresponds to:

FB 86 10 F6 F8 7E

In accordance with various embodiments of the invention bit markers or symbol separating markers are introduced to allow fast finding of a specific marker.

The bit markers may be made of series of binary ones of a length that is a multiple of eight and at least 16 bits long. The most interesting marker being made of 16 binary ones, i.e. 11111111 11111111.

If we want to mark the boundary after symbol "A" in the stream, it would be done by inserting 16 binary ones after the symbol "A" in the stream:

| C | B | C | D | B | E | D | C | A | bit marker | B |
|---|---|---|---|---|---|---|---|---|---|---|
| 111 | 110 | 111 | 0000 | 110 | 0001 | 0000 | 111 | 10 | 1111111111111111 | 110 |

Thus the resulting bit stream becomes:

11111011100001100001000011110111111111111111 01111100001111110

The same bit stream written in hexadecimal numbers is:

FB 86 10 F7 FF FE F8 7E

Now, as we have written sixteen binary ones in the stream, our marker will always result in at least one "FF" byte that is never followed by a "00"; meaning that the naturally occurring FF codes can be marked with "FF00" to indicate a non-marker; every other FF occurrence is guaranteed to be a marker in accordance with various embodiments of the invention.

This means that we can easily locate the byte FF in the bit stream seen as consecutive bytes, and we can then by using simple arithmetic logic remove the marker and restore the original stream.

The bytes up to the byte before the marker can be copied directly, as well as the bytes one byte after the marker. The remaining task is to restore the byte which was split by inserting the binary ones, marked in parenthesis.

FB 86 10 (F7 FF FE) F8 7E

The F7 FF FE written in binary numbers looks as follows:

| B1 | B2 | B3 | |
|---|---|---|---|
| 11110111 | 11111111 | 11111110 | or more generally |
| B1 | B2 | B3 | |
| abcde111 | 11111111 | 11111fgh | |

The operation to remove the inserted bits becomes very simple, as the inserted binary ones can be seen as bit masks when joining them together:

Original byte=B1 & B3=abcde111 & 11111fgh=abcdefgh
The resulting stream will become:
FB 86 10 (F7&FE) F8 7E=FB 86 10 F6 F8 7E If the symbol before or after the sixteen ones was known and it contains at least one zero, it is trivial to find out the bit position of the boundary between the marked symbols, i.e. the position of the marker. The position of the marker is the position of the next symbol, when the marker has been removed.

This may be achieved by finding the first zero to the left of "FF" and by knowing the appearance and/or code of the symbol containing the zero and then calculate where that symbol ends.

Another way to achieve this is by using a lookup table of 256 entries for the byte before the "FF" where all possible entries with the known symbol are entered, with the bit position (p) as the value in the table.

The Example Below Illustrates the Lookup Technique:

Assume that the known symbol before the sixteen ones is 10, then the only possibilities for the Byte1 are the following, where the x:s are all permutations of binary ones and binary zeros, and the p indicates the first bit of the 16 ones.

| Byte1 Byte2 |
| --- |
| xxxxxx10 p1111111, 64 permutations, pos = 8 |
| xxxxx10p 11111111, 32 permutations, pos = 7 |
| xxxx10p1 11111111, 16 permutations, pos = 6 |
| xxx10p11 11111111, 8 permutations, pos = 5 |
| xx10p111 11111111, 4 permutation, pos = 4 |
| x10p1111 11111111, 2 permutation, pos = 3 |
| 10p11111 11111111, 1 permutation, pos = 2 |
| 0p111111 11111111, 1 permutation, pos = 1 |

In the above example the lookup for F7 (11110111) would result in pos=6, (111101p11==111101111).

If the symbol is not known, it would be possible for instance to always insert a known code (K) that has preferably a total length that is 8 bits long, allowing us to remove it easily while knowing the symbol needed for locating the boundary between the marked symbols.

A very good code to use for this purpose is "00000000", as it can be used as a bit mask when removing the marker, i.e.:
K=0000 0000

Such modified stream would have the appearance:

| C | B | C | D | B | E | D | C | A | K |
| --- | --- | --- | --- | --- | --- | --- | --- | --- | --- |
| 111 | 110 | 111 | 0000 | 110 | 0001 | 0000 | 111 | 10 | 00000000 |

| bit marker | B | C | B | E | C | B |
| --- | --- | --- | --- | --- | --- | --- |
| 1111111111111111 | 110 | 111 | 110 | 0001 | 111 | 110 |

Arranged into bytes the modified stream would have the appearance:

11111011 10000110 00010000 11110000 00000111 11111111 11111110 11111000 01111110 and written in hexadecimal numbers this becomes:
FB 86 10 (F0 07 FF FE) F8 7E

From the above it is possible to find the FF, and by looking at the byte before the FF representing the known symbol K, it is possible to understand where the symbol K ends and, thus, calculate backwards to find where the symbol before K ends, representing the boundary between the marked symbols.

The symbol K has its first binary zero from right in the first position, hence the symbol before the symbol K ends 7 positions to the left of the found binary zero.

F0 07 FF FE=11110000 00000111 11111111 11111110

The removal can then be performed by finding the first occurrence of a binary zero to the left of the FF, marked with x below:

11110000 0000x111 11111111 11111110

And after that occurrence is found, remove the next 24 bits starting from 7 bits left of the found binary zero, marked with r:

11110rrr rrrrrrrr rrrrrrrr rrrrr110

It is now possible to join the four bytes into one, resulting in:

1111110=F6

The total resulting byte array thus becomes the original stream:
FB 86 10 F6 F8 7E.

The above removal of the marker is easily done by some simple arithmetic logic, as the K being zero can act as a mask:

| B1 | B2 | B3 | B4 |
| --- | --- | --- | --- |
| abcd0000 | 00000111 | 11111111 | 1111efgh |

$B = (B1 | B2) \& B4 = (F0 | 07) \& FE = F7 \& FE = F6$

An example of using the marking method when two or more signals are sent through the same channel is given below.

Consider the two bit streams below that are to be sent through only one channel.

| | A | B | C | D | B | E | D | A | C | B | D |
| --- | --- | --- | --- | --- | --- | --- | --- | --- | --- | --- | --- |
| Stream A | 10 | 110 | 111 | 0000 | 110 | 0001 | 0000 | 10 | 111 | 110 | 0000 |

| B | E | C | B |
| --- | --- | --- | --- |
| 110 | 0001 | 111 | 110 |

Written in hexadecimal numbers this becomes:
B7 0C 21 7C 18 7E

| | A | B | E | D | C | E | B | A | B | A | C |
| --- | --- | --- | --- | --- | --- | --- | --- | --- | --- | --- | --- |
| Stream B | 10 | 110 | 0001 | 0000 | 111 | 0001 | 110 | 10 | 110 | 10 | 111 |

| D | A | B | D | A |
| --- | --- | --- | --- | --- |
| 0000 | 10 | 110 | 0000 | 10 |

Written in hexadecimal numbers this becomes:
B0 87 1D 6B 85 82

The streams are alternated in this example so that five code words of stream A is sent, and then eight code words of stream B is sent, and then five code words of stream A, and so on:

| | A | B | C | D | B |
| --- | --- | --- | --- | --- | --- |
| Stream A | 10 | 110 | 111 | 0000 | 110 |

| | A | B | E | D | C | E | B | A |
| --- | --- | --- | --- | --- | --- | --- | --- | --- |
| Stream B | 10 | 110 | 001 | 0000 | 111 | 0001 | 110 | 10 |

-continued

| | E | D | A | C | B |
|---|---|---|---|---|---|
| Stream A | 0001 | 0000 | 10 | 111 | 110 |

| | B | A | C | D | A | B | D | A |
|---|---|---|---|---|---|---|---|---|
| Stream B | 110 | 10 | 111 | 0000 | 10 | 110 | 0000 | 10 |

| | D | B | E | C | B |
|---|---|---|---|---|---|
| Stream A | 0000 | 110 | 0001 | 111 | 110 |

Resulting in a binary stream:

1011011100001101011000010000111000110100001000010111110110101110000101100000100000110000111110

Written in hex:

B7 0D 61 0E 3A 10 BE D7 0B 04 18 7E

The receiver now has to process all the VLC symbols in order to recreate the two original streams.

Embodiments of the invention introduce the special markers in order to be able to separate the two streams in a more efficient manner, note that normally the scheme of inserting the marker happens much more seldom than in the following example, thus not requiring much overhead:

| | A | B | C | D | B | | E |
|---|---|---|---|---|---|---|---|
| Stream A | 10 | 110 | 111 | 0000 | 110 | 000000001111111111111111 | 0001 |

| | D | A | C | B | | D |
|---|---|---|---|---|---|---|
| | 0000 | 10 | 111 | 110 | 000000001111111111111111 | 0000 |

| | B | E | C | B |
|---|---|---|---|---|
| | 110 | 0001 | 111 | 110 |

B7 0C 01 FF FE 21 7C 01 FF FE 18 7E

| | A | B | E | D | C | E | B | A |
|---|---|---|---|---|---|---|---|---|
| Stream B | 10 | 110 | 0001 | 0000 | 111 | 0001 | 110 | 10 |

| | | B | A | C | D |
|---|---|---|---|---|---|
| | 000000001111111111111111 | 110 | 10 | 111 | 0000 |

| | A | B | D | A | |
|---|---|---|---|---|---|
| | 10 | 110 | 0000 | 10 | 000000001111111111111111 |

B0 87 1D 00 7F FF EB 85 82 00 FF FF

Now the streams can be alternated at the FF markers by outputting the first stream until FF, then continuing with the second stream until FF, and then continuing the first stream until next FF and so on, resulting in the following transmitted stream:

B7 0C 01 FF B0 87 1D 00 7F FF FE 21 7C 01 FF EB 85 82 00 FF FF FE 18 7E

Now in order for the receiver to separate the streams, she separates the streams by FF, inverting the above process:

| StreamA: | B7 | 0C | 01 | FF | FE | 21 | 7C | 01 | FF | FE | 18 | 7E |
|---|---|---|---|---|---|---|---|---|---|---|---|---|
| StreamB: | B0 | 87 | 1D | 00 | 7F | FF | EB | 85 | 82 | 00 | FF | FF |

Each stream can now be processed to remove the markers by simple arithmetic logic:

$B=(b1|b2)\&b4$,

Stream A: B7 0C 01 FF FE 21 7C 01 FF FE 18 7E
Stream B: B0 87 1D 00 7F FF EB 85 82 00 FF FF becomes Stream A: B7 (0C|01)&FE 21 (7C|01)&FE 18 7E=B7 0C 21 7C 18 7E Stream B: B0 87 1D (00|7F)&EB 85 (82|00)&FF=B0 87 1D 6B 85 82 which is the original stream. The splitting operation on the receiving side was done entirely without any bit operations, or variable length coding.

According to further embodiments, the symbol K could be any 7 bit number with a pre defined zero in a predefined bit position. The above description may be extended to find the start of the marker by knowing the position of the predefined zero. According to one of the embodiments the zero is the least significant bit, and the most significant seven bit could be used for other data, for instance a number increasing from zero to 127. In that way it would be easy to skip over up to 128 marked code words just by looking at the byte stream.

According to one aspect of the invention, the above described general method may be implemented for use in processing JPEG streams. A way of modifying an existing JPEG Encoder with minimal changes in order to create an alternative stream of non-compliant JPEG data including special markers that indicate end of DU is described below. The noncompliant JPEG data can then be analyzed to map the beginning of each DU, and the non-compliant markers can be removed while storing it to a non-volatile memory.

Further, it should be noted that a code word is intended to be understood as a series of bits that can be decoded to produce a previously encoded unit. All code words are not of the same length. Despite this fact, they are not strictly meant to be read as a variable length representation of a single symbol. An example of such more complex code words is the ones used in a jpeg stream. A JPEG codeword as defined here encodes a series of zeros followed by a non-zero number into a combination of a symbol for the zero run length together with the magnitude of the non-zero number, followed by the least significant bits of the number based on the magnitude.

The whole series of bits produced for the series of zeros followed by the non-zero number or any of their subsets can thus be read as a codeword according to our definition.

Other subsets to be read as a codeword would be the combination of a symbol for the zero run length together with the magnitude of the non-zero number, or the bits representing the least significant bits.

A JPEG stream consists of multiple Data Units (DUs) of 64 coefficients. The coefficients are represented by Huffman coded symbols of variable length, usually the last coefficients are zeros, and an End Of Block (EOB) symbol is used to terminate a Data Unit (DU) that has zeros in the end.

For some applications it is very useful to know the bit positions of the DUs.

1) Instant display of a large JPEG image on a small screen. If the DU positions are known, then it is very quick to decode only the first coefficient(s) of a block and thus create a scaled down version of the original image.

2) If DU positions are known, it is possible to randomly access any DU. If the absolute DC coefficients are known as well, it is possible to decode an area of a JPEG without a need of decoding the previous blocks.

The method allows modifying of an encoder component, which may reside in hardware, in order to create markers indicating end of a block, which a receiving SW component can use to find the DU positions, and afterwards easily remove the markers, thus allowing for fast creation of a DU position database, and/or a scaled down version of the encoded image. The encoding may be performed in HW due to speed issues. This is a simple approach to allowing standard JPEG HW to be modified without requirement of extra memory for storing the start positions of the data units of the JPEG data stream. The extra memory would need to be 2*number_of_data_units (16 bit)=>2mpix=60000 DU's=>120 kb memory, which is very expensive, as it preferably is zero wait state memory, occupying a large silicon area.

The following description covers both encoding and decoding of such JPEG data.

Encoder:

1) Modify HW so that EOB is always created. Alternatively use clever Q tables to guarantee that the HW puts an EOB always in the end. If a zero is always inserted into the quantized coefficient nr 64, the hardware will need to insert an EOB.

2) Make sure that for each FF occurring in the original Huffman coded stream a trailing "00" is inserted. This is already done in a valid JPEG stream.

3) After each DU (or EOB) add a multiple of eight but at least 16 binary ones

This could also be done by modifying the Huffman tables so that EOB symbol is modified to contain the usual 2-4 byte symbol, with 12 trailing binary ones, and the DC tables are modified to contain four ones before the real DC symbol. Then the encoder is forced to always encode EOBs in the bit stream. This means that between the EOB and the DC there will always be a marker of 16 binary ones.

As an example of this embodiment the normal EOB and the new EOB, in view of the above discussed adjustment to the normal EOB given, may be like below:

Normal EOB: 1010

New EOB: 1010111111111111

Moreover, the normal DCs and the new DCs may relate to each other as described in the table below:

| Normal DCs: | New DCs: |
| --- | --- |
| 000 | 1111000 |
| 001 | 1111001 |
| 010 | 1111010 |
| 011 | 1111011 |
| 100 | 1111100 |
| 110 | 1111110 |
| 1110 | 11111110 |
| 11110 | 111111110 |
| 111110 | 1111111110 |
| 1111110 | 11111111110 |
| 11111110 | 111111111110 |
| 111111110 | 1111111111110 |

This scheme results in that, using the example of the EOB above and the example of a new DC being the third DC in the table above, EOB combined with the third DC corresponds to "1010 1111111111111111 010". Hence, the result is the same as when adding 16 binary ones after an EOB.

An example of adding 16 binary ones by means of one embodiment of the method is given below, the below example is generalized to a general Huffman coded stream.

The example uses the following Huffman table:

A=10 (EOB)

B=110

C=111

D=0000

E=0001

A Huffman coded string of symbols "CBCDBEDCAB-CBECB" encoded in hardware results in the bit stream below:

11111011 10000110 00010000 111<u>10</u>110 11111000 01111110 . . .

FB 86 10 F6 F8 7E

The underlined portion indicates EOB.

Then the 16 binary ones are inserted after the EOB:

11111011 10000110 00010000 111<u>10</u>111 11111111 11111110 11111000 01111110 . . .

FB 86 10 F7 FF FE F8 7E

Now an example of decoding is given, the decoding may be performed in software.

Step 1. Seek FF that has no trailing "00". In a JPEG stream only "FF 00" is allowed, but that cannot occur with these rules. Meaning that it is 100% certain that the sought FF is our marker. (Provided that the restart markers are not used in the JPEG stream)

Now, seek down towards the EOB symbol (10 in this example), and the start of the next DU is found right after the EOB.

Remove sixteen ones, and remember the bit address for the next DU.

11111011 10000110 00010000 111<u>10</u>110 11111000 01111110 . . .

| FB | 86 | 10 | F7 | FF | FE | F8 | 7E |
| --- | --- | --- | --- | --- | --- | --- | --- |
| FB | 86 | 10 | F6 |  |  | F8 | 7E |

As is seen, only one byte has to be modified, two bytes has to be removed, and the rest of the bytes are already correctly word aligned:

| FB | 86 | 10 | F7 | FF | FE | F8 | 7E |
|----|----|----|----|----|----|----|----|
| FB | 86 | 10 | F6 |    |    | F8 | 7E |

Even better if the inserted number of ones was 32, then the rest would be long word aligned, allowing for 32 bit memcpy. This may not always be desirable as adding two more bytes increases the size of the file and thus increases the bandwidth requirements when moving the data across the bus of the network.

| FB | 86 | 10 | F7 | FF | FF | FF | FE | F8 | 7E |
|----|----|----|----|----|----|----|----|----|----|
| FB | 86 | 10 | F6 |    |    |    |    | F8 | 7E |

The process of joining the two bytes into one is also very trivial:

| FB | 86 | 10 | F7 | FF | FE | F8 | 7E |
|----|----|----|----|----|----|----|----|
| FB | 86 | 10 | F6 |    |    | F8 | 7E |

The operation that joins the F7 and the FE is very simple, it is just a logical "and" operation of them, as the inserted 16 ones act as a bit mask.

Byte1=F7
Byte2=FE
Joined Byte=Byte1 & Byte2
It is easier to see the above when considering the below example:
abcde111 11111111 11111fgh
Byte1=abcde111
Byte2=11111fgh
Joined Byte=abcde111 & 11111fgh=abcdefgh The above example describes a process of quickly finding the bit addresses of all DUs in a stream, and the process of quickly removing the markers in order to recreate the original stream.

The algorithm may be modified for use in finding the DC coefficients of each DU. Then, by decoding the DC coefficients the data of each DC may be used increate an 8 times smaller version of the image. The same can be done if a four times smaller representation is needed, where the DC coefficient and a number of subsequent AC's are decoded in order to be able to perform a 2×2 IDCT on the coefficients. By having the markers indicate the position of DC coefficients it becomes possible to skipHuffman decoding the other coefficients, thus allowing much faster scaling of images to small screens in the capturing moment. This implementation may be used in any application in order to speed up the process of displaying a reduced size image.

One example of such an application is image acquisition applications using the display as a view finder. One general problem in these applications is the delay of the presentation of an image representing the image view. In other words, when the user sees the desired view on the display the moment may be long gone. In an application like this the delay may be substantially reduced by providing an data stream including markers indicating the position of the DC coefficients and implementing a display process that seeks the markers, retrieve the information relating to the DC coefficients at the markers, and generate an reduced size image from this information to be presented on the display.

Further, according to one aspect of the invention a way of modifying a JPEG Encoder with minimal changes in order to create an alternative stream of non-compliant JPEG data including special markers that indicate end of DU is presented. The noncompliant JPEG data can then be analyzed to map the beginning of each DU, and the non-compliant markers can be removed while storing it to a non-volatile memory.

In the above examples the marker is set to at least 16 binary ones. The marker may as well be set to at least 16 binary zeros, i.e. 0000000000000000. If the marker is set to 16 binary zeros the known code inserted before the marker may be "11111111". Hence the code 00000000111111111111111 is inverted to 1111111100000000000000.

The invention can be implemented in digital electronic circuitry, or in computer hardware, firmware, software, or in combinations of them. Apparatus of the invention can be implemented in a computer program product tangibly embodied in a machine-readable storage device for execution by a programmable processor; and method steps of the invention can be performed by a programmable processor executing a program of instructions to perform functions of the invention by operating on input data and generating output. The invention can be implemented advantageously in one or more computer programs that are executable on a programmable system including at least one programmable processor coupled to receive data and instructions from, and to transmit data and instructions to, a data storage system, at least one input device, and at least one output device. Each computer program can be implemented in a high-level procedural or object-oriented programming language, or in assembly or machine language if desired; and in any case, the language can be a compiled or interpreted language. Suitable processors include, by way of example, both general and special purpose microprocessors. Generally, a processor will receive instructions and data from a read-only memory and/or a random access memory. Generally, a computer will include one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM disks. Any of the foregoing can be supplemented by, or incorporated in, ASICs (application-specific integrated circuits).

To provide for interaction with a user, the invention can be implemented on a computer system having a display device such as a monitor or LCD screen for displaying information to the user. The user can provide input to the computer system through various input devices such as a keyboard and a pointing device, such as a mouse, a trackball, a microphone, a touch-sensitive display, a transducer card reader, a magnetic or paper tape reader, a tablet, a stylus, a voice or handwriting recognizer, or any other well-known input device such as, of course, other computers. The computer system can be programmed to provide a graphical user interface through which computer programs interact with users.

Finally, the processor optionally can be coupled to a computer or telecommunications network, for example, an Internet network, or an intranet network, using a network connection, through which the processor can receive information from the network, or might output information to the network in the course of performing the above-described method steps. Such information, which is often represented as a sequence of instructions to be executed using the processor, may be received from and outputted to the network, for example, in the form of a computer data signal embodied in a carrier wave. The above-described devices and materials will be familiar to those of skill in the computer hardware and software arts.

It should be noted that the present invention employs various computer-implemented operations involving data stored in computer systems. These operations include, but are not limited to, those requiring physical manipulation of physical quantities. Usually, though not necessarily, these quantities take the form of electrical or magnetic signals capable of being stored, transferred, combined, compared, and otherwise manipulated. The operations described herein that form part of the invention are useful machine operations. The manipulations performed are often referred to in terms, such as, producing, identifying, running, determining, comparing, executing, downloading, or detecting. It is sometimes convenient, principally for reasons of common usage, to refer to these electrical or magnetic signals as bits, values, elements, variables, characters, data, or the like. It should remembered however, that all of these and similar terms are to be associated with the appropriate physical quantities and are merely convenient labels applied to these quantities.

The present invention also relates to a device, system or apparatus for performing the aforementioned operations. The system may be specially constructed for the required purposes, or it may be a general-purpose computer selectively activated or configured by a computer program stored in the computer. The processes presented above are not inherently related to any particular computer or other computing apparatus. In particular, various general-purpose computers may be used with programs written in accordance with the teachings herein, or, alternatively, it may be more convenient to construct a more specialized computer system to perform the required operations.

A number of implementations of the invention have been described. Nevertheless, it will be understood that various modifications may be made without departing from the spirit and scope of the invention.

The invention claimed is:

1. Method for sending a first and a second variable length coded data stream through the same transport medium, the method comprising:
   inserting a separation marker between portions of each data stream, wherein the inserting of a separation marker is performed by inserting at least 16 consecutive binary ones; and
   alternating the sending of the data streams by outputting the first data stream until a first FF byte occurrence, outputting the second data stream until a second FF byte occurrence, outputting the first data stream until a third FF byte occurrence, and so on.

2. Method according to claim 1, further comprising inserting a set of eight bits before the separation marker, said set of eight bits including at least one bit of binary zero value and said at least one bit of binary zero value being arranged in a predetermined position in said set of eight bits.

3. Method according to claim 2, wherein the predetermined position of said at least one bit of binary zero value being the position as the least significant bit in the set of eight bits.

4. Method according to claim 1, wherein said inserting of a separation marker is performed in connection with the separate data streams being encoded by a variable length coding scheme.

5. Method according to claim 1, further comprising inserting eight binary zeros before the separation marker.

6. Method according to claim 1, wherein said insertion of a separation marker is performed by hardware.

7. Method for receiving a first and a second variable length coded data stream sent through the same transport medium as a joint stream of data according to claim 1, said method comprising:
   splitting the received stream of data into the first and second data stream by alternating the receiving of the first and second data streams by receiving the first data stream until the first FF byte occurrence in the joint stream of data, receiving the second data stream until the second FF byte occurrence in the joint stream of data, receiving the first data stream until the third FF byte occurrence in the joint stream of data, and so on; and
   removing the separation marker from each of the first data stream and the second data stream.

8. Method for sending a first and a second variable length coded data streams through the same transport medium, the method comprising:
   inserting a separation marker between portions of each data stream, wherein the inserting of a separation marker is performed by inserting at least 16 consecutive binary zeros; and
   alternating the sending of the first and the second data streams by outputting the first data stream until a first 00 byte occurrence, outputting the second data stream until a second 00 byte occurrence, outputting the first data stream until a third 00 byte occurrence, and so on.

9. Method according to claim 8, further comprising inserting a set of eight bits before the separation marker, the set of eight bits including at least one bit of binary one value and the at least one bit of binary one value being arranged in a predetermined position in the set of eight bits.

10. Method according to claim 9, wherein the predetermined position of the at least one bit of binary one value being the position as the least significant bit in the set of eight bits.

11. Method according to claim 8, wherein the inserting of a separation marker is performed in connection with the separate data streams being encoded by means of a variable length coding scheme.

12. Method according to claim 8, further comprising inserting eight binary ones before the separation marker.

13. Method according to claim 8, wherein the insertion of a separation marker is performed by hardware.

14. Method for receiving a first and a second variable length coded data stream sent through the same transport medium as a joint stream of data according to claim 8, the method comprising:
   splitting the received stream of data into the first and second data stream by alternating the receiving of the first and second data streams by receiving the first data stream until the first 00 byte occurrence in the joint stream of data, receiving the second data stream until the second 00 byte occurrence in the joint stream of data, receiving the first data stream until the third 00 byte occurrence in the joint stream of data, and so on; and
   removing the separation marker from each of the first data stream and the second data stream.

* * * * *